(12) United States Patent
Sakurai

(10) Patent No.: US 11,460,728 B2
(45) Date of Patent: Oct. 4, 2022

(54) PROCESSING DEVICE, PROGRAM, AND DISPLAY MEDIUM

(71) Applicant: DWANGO Co., Ltd., Tokyo (JP)

(72) Inventor: Kaisei Sakurai, Tokyo (JP)

(73) Assignee: DWANGO CO, LTD

( * ) Notice: Subject to any disclaimer, the term of this patent is extended or adjusted under 35 U.S.C. 154(b) by 0 days.

(21) Appl. No.: 17/257,544

(22) PCT Filed: Sep. 18, 2019

(86) PCT No.: PCT/JP2019/036449
§ 371 (c)(1),
(2) Date: Dec. 31, 2020

(87) PCT Pub. No.: WO2020/137031
PCT Pub. Date: Jul. 2, 2020

(65) Prior Publication Data
US 2021/0389625 A1   Dec. 16, 2021

(30) Foreign Application Priority Data
Dec. 27, 2018  (JP) .............................. JP2018-245335

(51) Int. Cl.
*G02F 1/1335* (2006.01)
*G02F 1/1333* (2006.01)
(Continued)

(52) U.S. Cl.
CPC .. *G02F 1/133512* (2013.01); *G02F 1/133377* (2013.01); *G06F 3/12* (2013.01); *H01L 27/3232* (2013.01)

(58) Field of Classification Search
None
See application file for complete search history.

(56) References Cited

U.S. PATENT DOCUMENTS

| 4,588,212 A | 5/1986 | Castagnoli |
| 5,032,003 A | 7/1991 | Antes |

(Continued)

FOREIGN PATENT DOCUMENTS

| CN | 105069692 A | 11/2015 |
| CN | 106651132 A | 5/2017 |

(Continued)

OTHER PUBLICATIONS

PCT/JP2019/036449 International Search Report and Written Opinion dated Nov. 26, 2019, 2 pgs.
(Continued)

*Primary Examiner* — Shan Liu
(74) *Attorney, Agent, or Firm* — Bracewell LLP; Doug Stewart; Patrick J. Connolly

(57) ABSTRACT

A display medium comprises a flat member that reflects light, in which the flat member is divided into a plurality of unit cells, and each of the plurality of unit cells is divided into a predetermined number of subcells corresponding to a predetermined number of azimuth angles. Projecting members having a light-blocking surface are formed perpendicular to the flat member on top of the flat member and parallel to a predetermined azimuth angle in each subcell corresponding to the predetermined azimuth angle. The subcells include a plurality of microcells for expressing a color of the content

7 Claims, 10 Drawing Sheets

(51) Int. Cl.
    *G06F 3/12*      (2006.01)
    *H01L 27/32*     (2006.01)

(56)           References Cited

U.S. PATENT DOCUMENTS 11,094,233  B2    8/2021   Sakurai
   2008/0284157 A1  11/2008   Muke et al.
   2008/0314441 A1  12/2008   Mather
   2014/0226093 A1   8/2014   Schwartz et al.

FOREIGN PATENT DOCUMENTS

JP        H06255231  A       9/1994
   JP        H07164799  A       6/1995
   JP        2002099223 A   *   4/2002
   JP        2002099223 A       4/2002
   JP           6374625 B1  *   8/2018   ............ G09F 13/14
   JP           6374625 B1      8/2018
   JP        2020106664 A       7/2020
   WO        2006049213 A1      5/2006

OTHER PUBLICATIONS

CN 201980062457 First Office Action dated May 25, 2022, 14 pgs.
EP18903526.4 Extended European Search Report dated Jan. 17, 2022, 12 pgs.
JP2018-017219 Decison to Grant dated Jul. 5, 2018, 7 pgs.
JP2018-017219 First Office Action dated Apr. 26, 2018, 6 pgs.
U.S. Appl. No. 16/322,478 First Non-Final Office Action dated Oct. 2, 2020, 14 pgs.
U.S. Appl. No. 16/322,478 Second Non-Final Office Action dated Feb. 5, 2021, 5 pgs.

* cited by examiner

[Fig. 1]
(a)
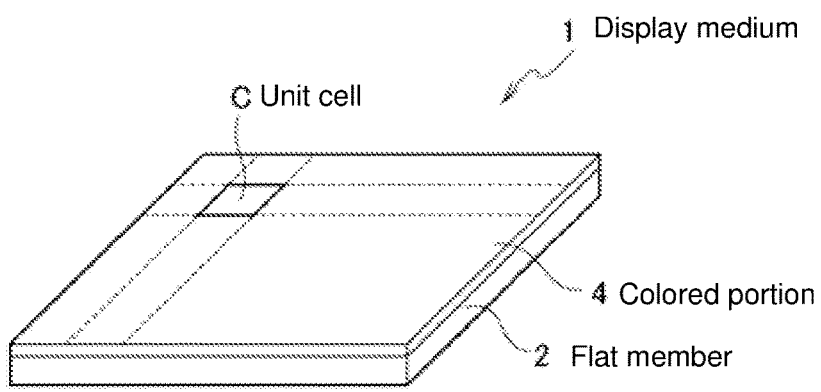
(b)
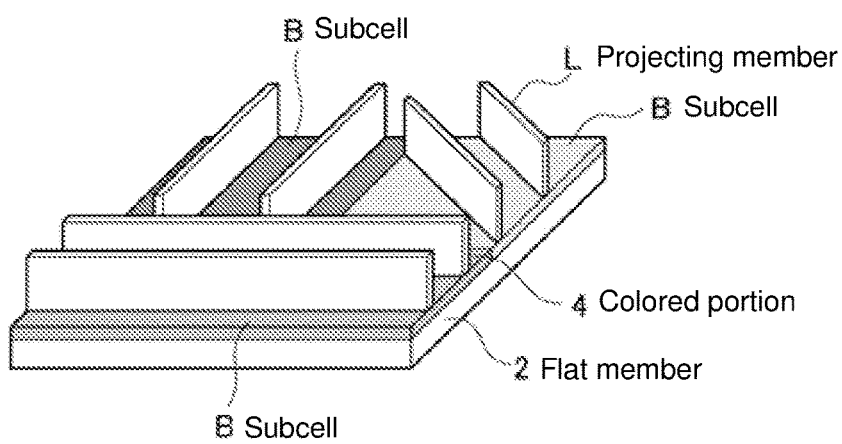

[Fig. 2]
(a)
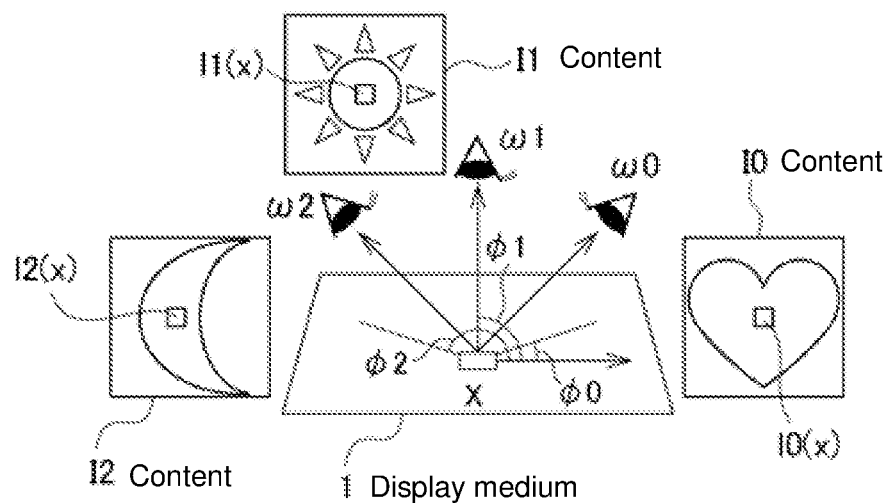
(b)
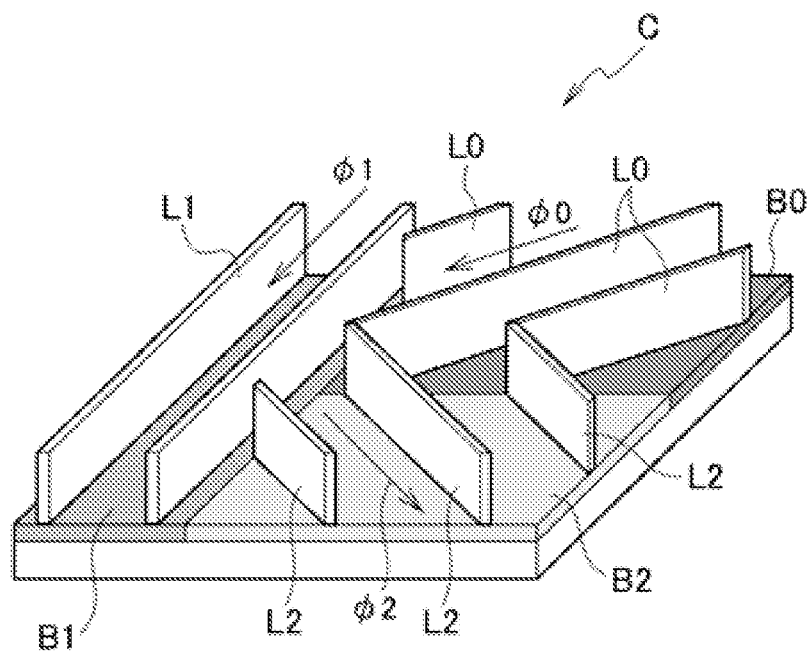

[Fig. 3]
(a)
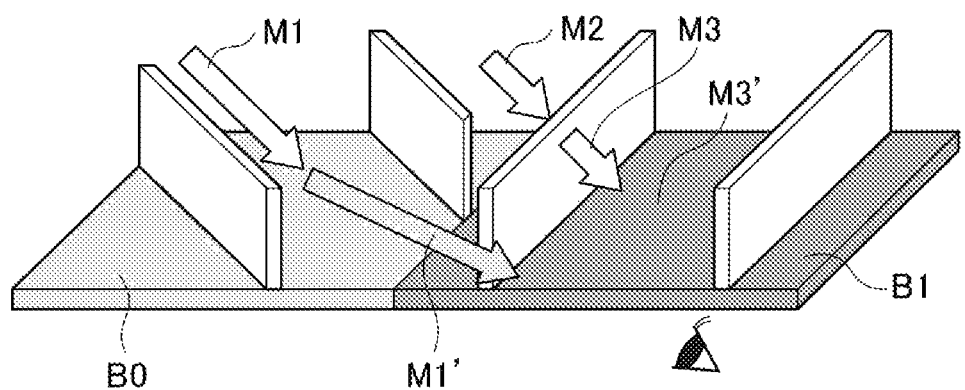
(b)
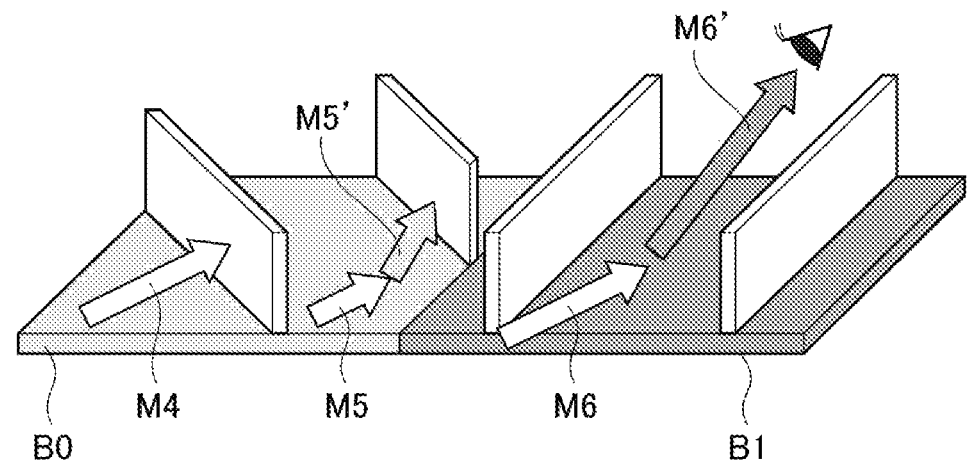

[Fig. 4]
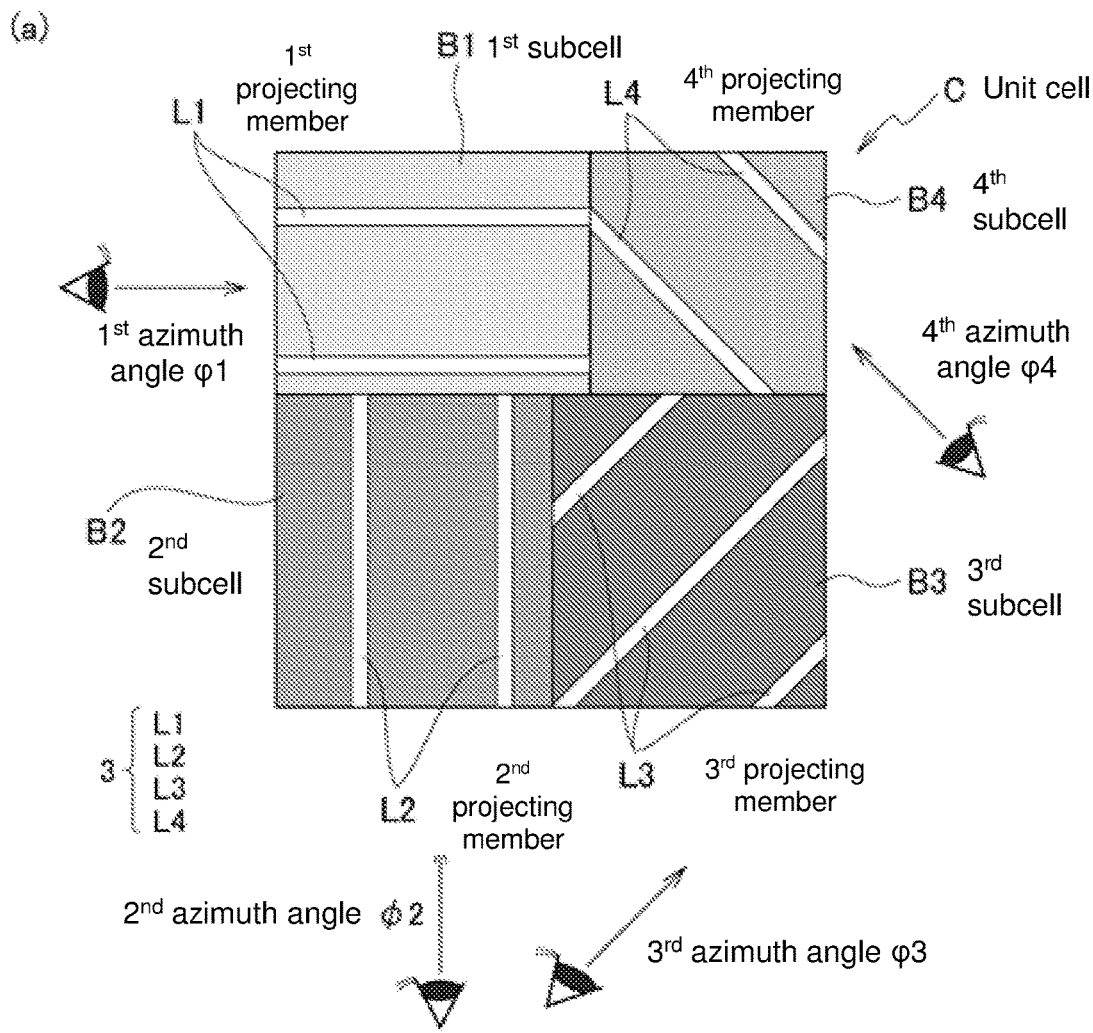
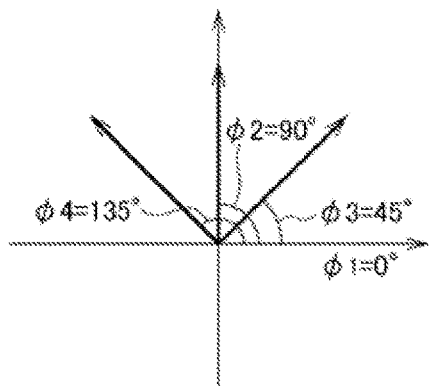

[Fig. 5]
(a)
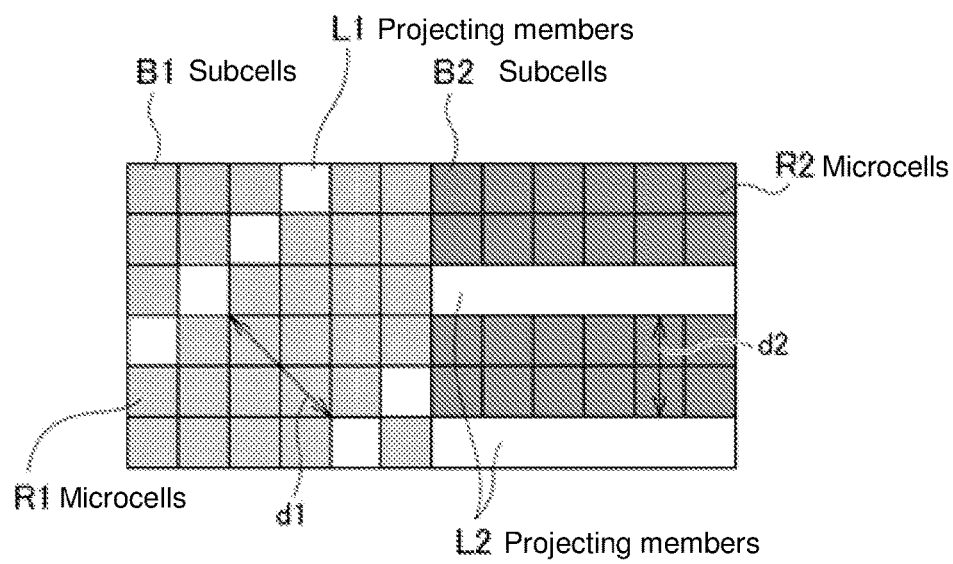
(b)
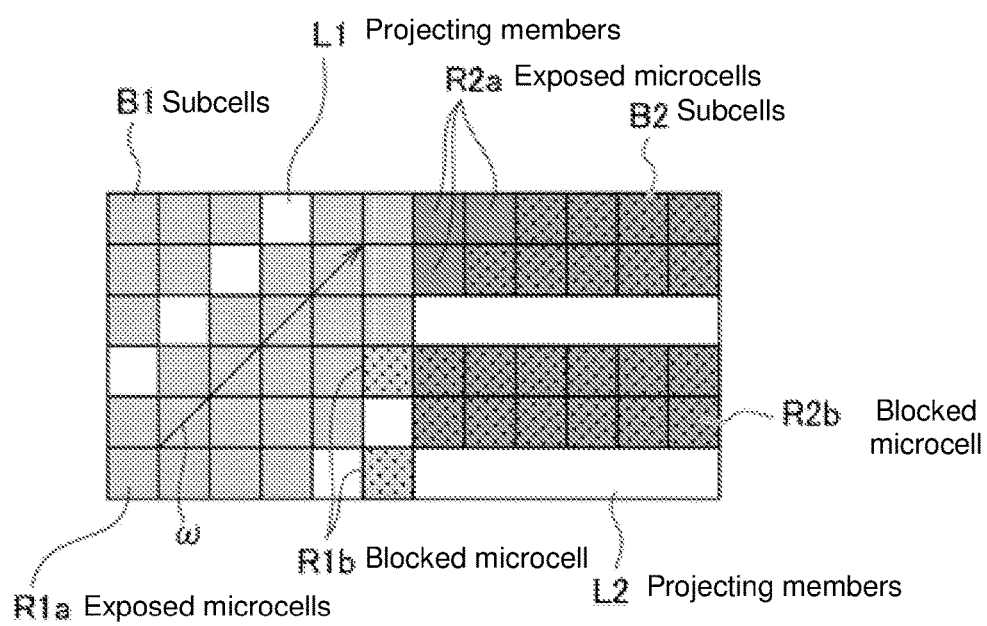

[Fig. 6]
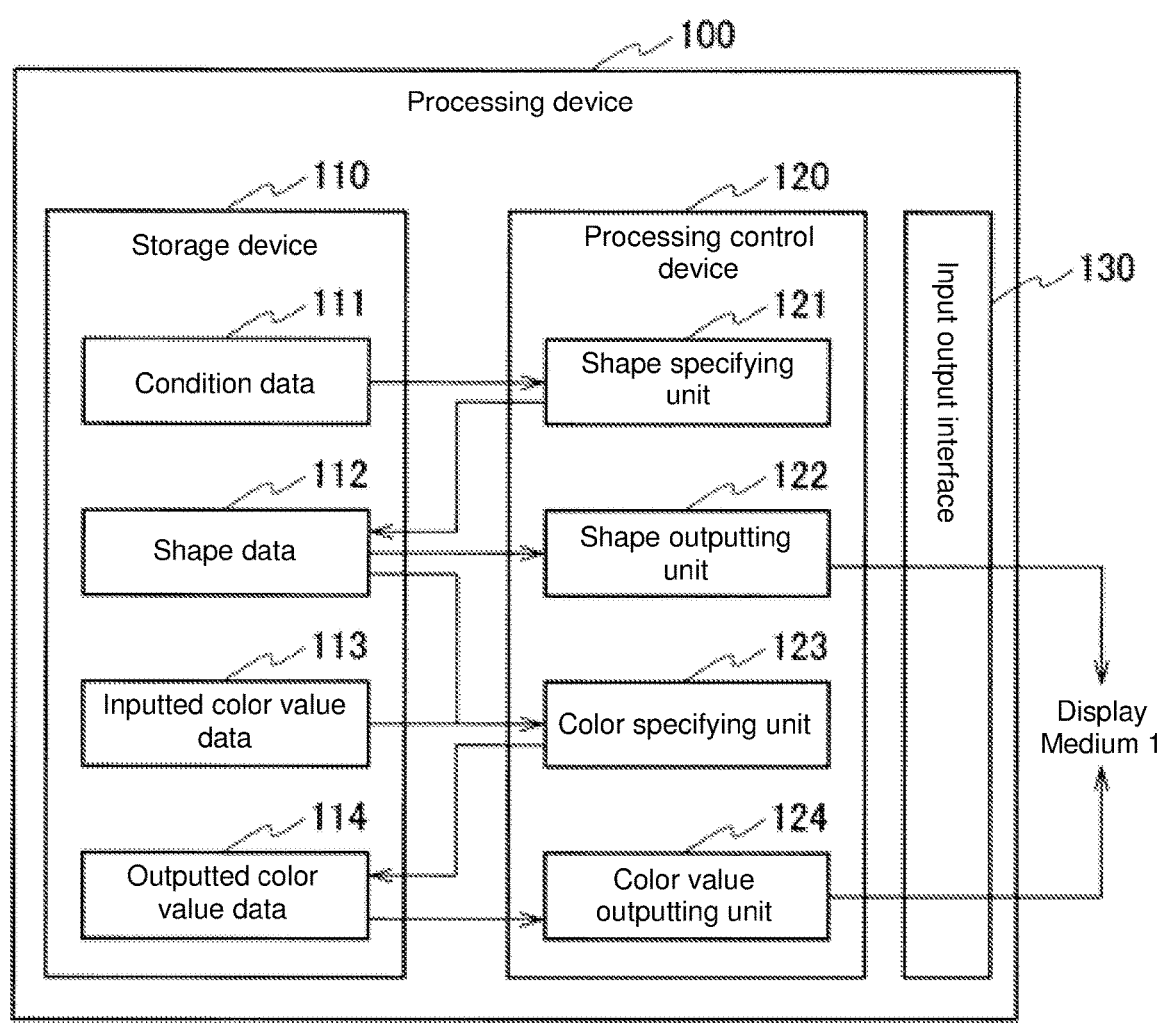

[Fig. 7]
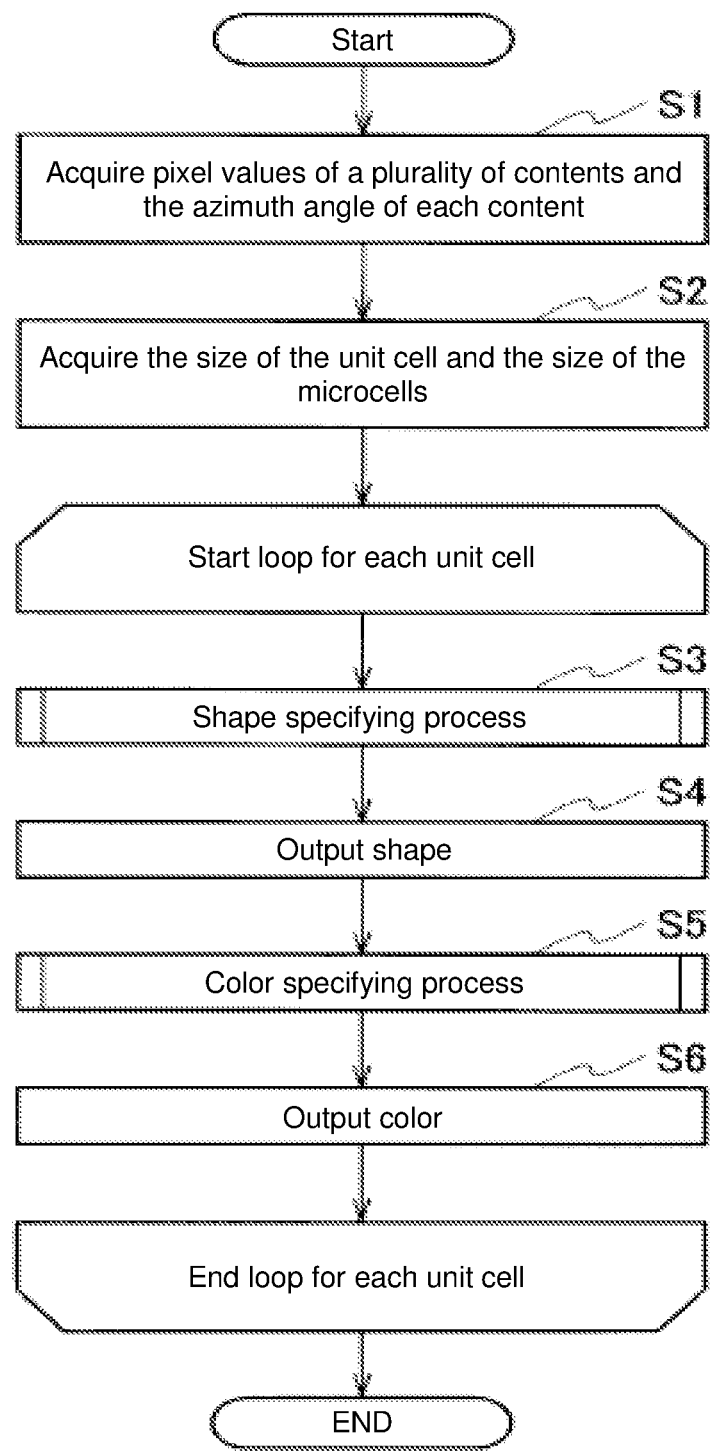

[Fig. 8]
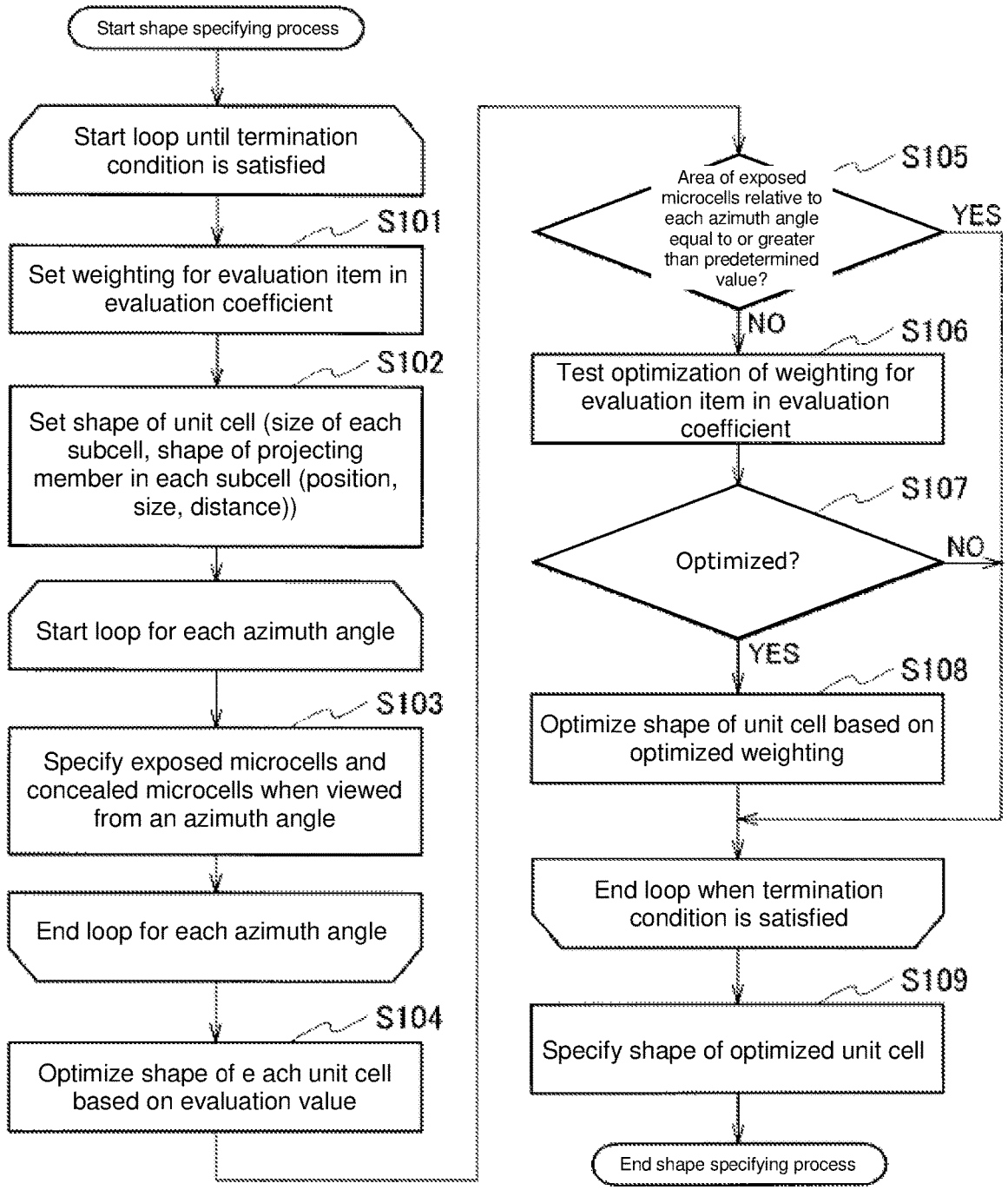

[Fig. 9]
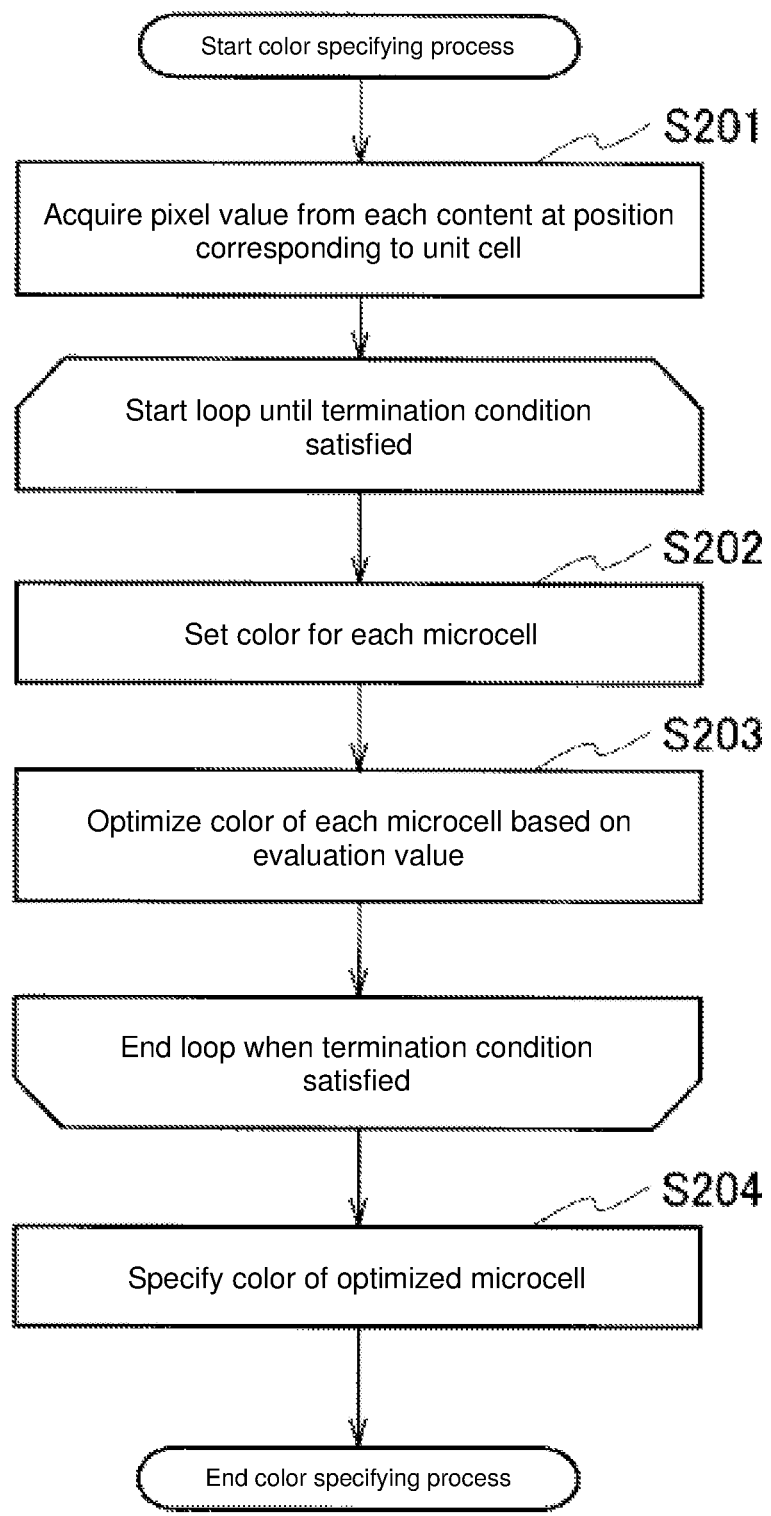

[Fig. 10]
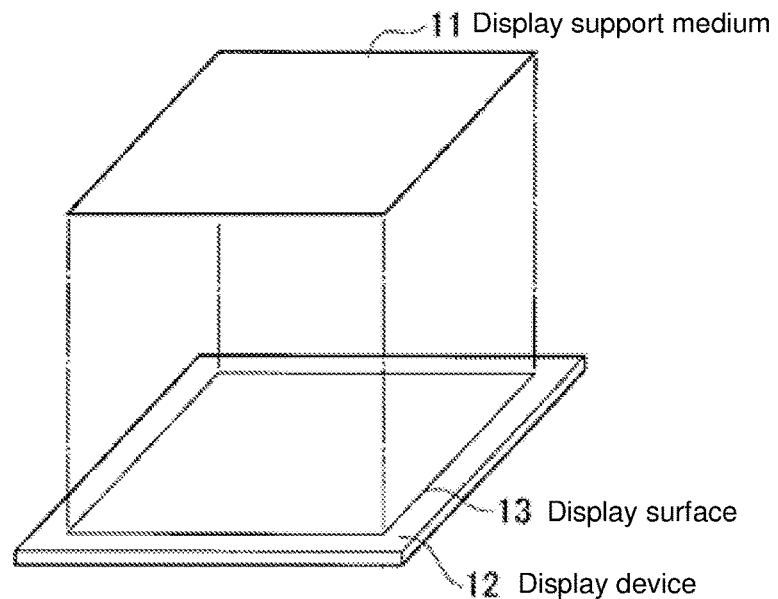
[Fig. 11]
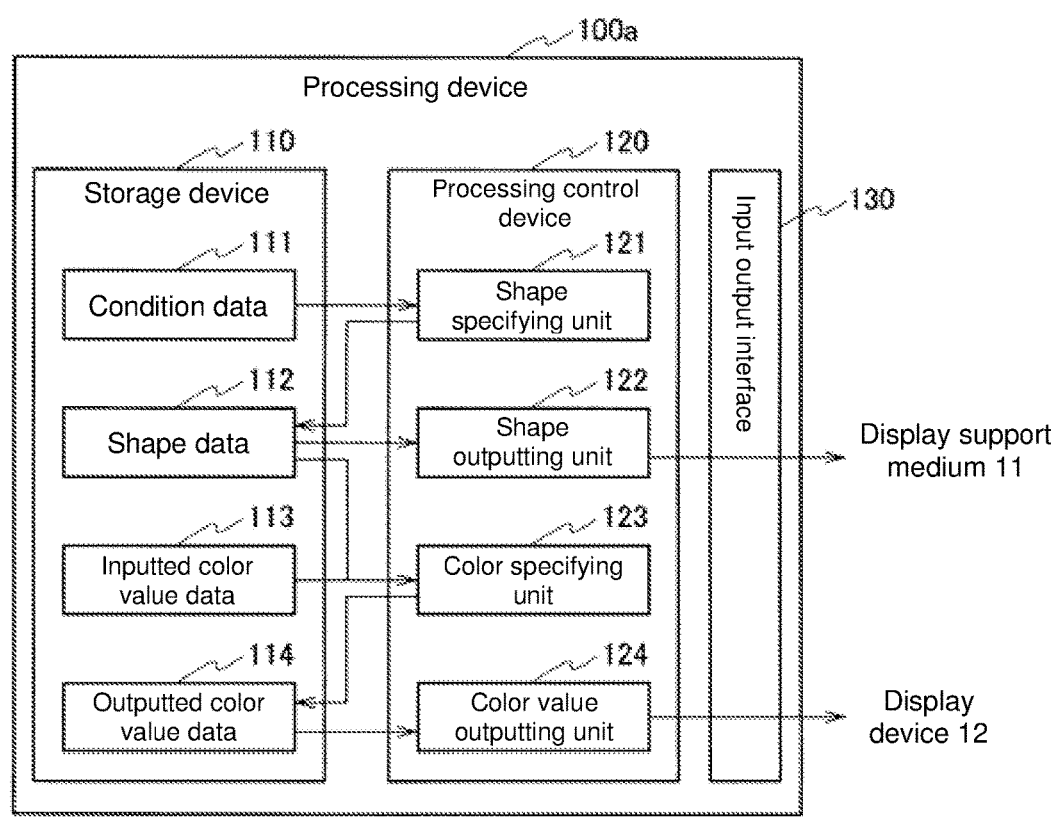

PROCESSING DEVICE, PROGRAM, AND DISPLAY MEDIUM

TECHNICAL FIELD

The present invention relates to a processing device, a program, and a display medium.

BACKGROUND ART

There are display media that enable a predetermined number of contents corresponding to a predetermined number of azimuth angles to be displayed from a predetermined elevation angle and azimuth angle (see Patent Document 1). These display media comprise a flat member that reflects light, and a plurality of projecting members arranged perpendicular to the flat member that have surfaces that block light. The flat member is divided into a plurality of unit cells, and each of the plurality of unit cells is divided into a predetermined number of subcells corresponding to a predetermined number of azimuth angles. A projecting member having a surface parallel to a predetermined azimuth angle is formed in each subcell in each subcell corresponding to the predetermined azimuth angle.

Patent Document 1 discloses that it gives color to the subcells. Content corresponding to a predetermined azimuth angle can be ascertained based on the color given to the subcells when the display medium is viewed from a predetermined elevation angle and azimuth angle.

PRIOR ART DOCUMENTS

Patent Documents

Patent Document 1: JP 6374625 B2

SUMMARY OF THE INVENTION

Problem to be Solved by the Invention

Patent Document 1 does not specifically describe how color is given to subcells and does not touch upon a configuration that vividly displays content.

Therefore, it is an object of the present invention to provide a processing device, a program, and a display medium that can vividly display content.

Means for Solving the Problem

In order to solve this problem, the first aspect of the present invention relates to a processing device used to produce a display medium enabling a predetermined number of contents corresponding to a predetermined number of azimuth angles to be displayed from a predetermined elevation angle and azimuth angle. The display medium according to the first aspect of the present invention comprises a flat member that reflects light, the flat member being divided into a plurality of unit cells, each of the plurality of unit cells being divided into a predetermined number of subcells corresponding to a predetermined number of azimuth angles, projecting members having a light-blocking surface being formed perpendicular to the flat member on top of the flat member and parallel to a predetermined azimuth angle in each subcell corresponding to the predetermined azimuth angle, and the subcells including a plurality of microcells for expressing a color of the content. The processing device comprises a shape specifying unit that specifies the size of each subcell or the shape of the projecting members in each subcell in a unit cell on the basis of the position of the microcells concealed by the projecting members when the unit cell is observed from each of the predetermined number of azimuth angles.

The second aspect of the present invention relates to a processing device used to produce a display medium able to be affixed to a display surface having a flat surface that reflects light and enabling a predetermined number of contents corresponding to a predetermined number of azimuth angles to be displayed from a predetermined elevation angle and azimuth angle. The display support medium according to the second aspect of the present invention comprises a sheet-like member having a sheet-like form that transmits light, the sheet-like member being divided into a plurality of unit cells, each of the plurality of unit cells being divided into a predetermined number of subcells corresponding to a predetermined number of azimuth angles, projecting members having a light-blocking surface being formed perpendicular to the sheet-like member on top of the sheet-like member at a predetermined azimuth angle in each subcell corresponding to the predetermined azimuth angle, and the subcells including a plurality of microcells for expressing a color of the content. The processing device comprises a shape specifying unit that specifies the size of each subcell or the shape of the projecting members in each subcell in a unit cell on the basis of the position of the microcells concealed by the projecting members when the unit cell is observed from each of the predetermined number of azimuth angles.

In the first and second aspects of the present invention, the shape specifying unit may specify the size of each subcell or the shape of the projecting members in each subcell using simulated annealing.

In the first and second aspects of the present invention, the shape specifying unit may specify the size of each subcell or the shape of the projecting members in each subcell using a genetic algorithm.

In the first and second aspects of the present invention, the shape specifying unit, after specifying the size of each subcell or the shape of the projecting members in each subcell, may change the weighting of evaluation items in the evaluation function used to specify the size of each subcell or the shape of the projecting members in each subcell so that the area of the microcells exposed with respect to the projecting members is equal to or greater than a specified value when the unit cell is viewed from each of the predetermined number of azimuth angles.

The third aspect of the present invention relates to a processing device used to produce a display medium that determines the color of a flat member in a display medium enabling a predetermined number of contents corresponding to a predetermined number of azimuth angles to be displayed from a predetermined elevation angle and azimuth angle. The display medium according to the third aspect of the present invention comprises a flat member that reflects light, the flat member being divided into a plurality of unit cells, each of the plurality of unit cells being divided into a predetermined number of subcells corresponding to a predetermined number of azimuth angles, projecting members having a light-blocking surface being formed perpendicular to the flat member on top of the flat member and parallel to a predetermined azimuth angle in each subcell corresponding to the predetermined azimuth angle, and the subcells including a plurality of microcells for expressing a color of the content. The processing device comprises a storage device for storing the pixel values at the positions corresponding to the unit cells for each of the predetermined number of contents, and a color specifying unit that calculates for each of the predetermined azimuth angles the pixel values to be displayed on the basis of the colors of the viewable microcells when a unit cell is viewed from a predetermined azimuth angle, and the differences in pixel values at positions corresponding to the unit cell in the content corresponding to the predetermined azimuth values, and specifies the color of each microcell in the unit cell so that the sum of the differences calculated for each of the predetermined number of azimuth angles is smaller.

The fourth aspect of the present invention relates to a processing device that determines the color of a display surface on which is affixed a display support medium able to be affixed to a display surface having a flat surface that reflects light and enabling a predetermined number of contents corresponding to a predetermined number of azimuth angles to be displayed from a predetermined elevation angle and azimuth angle. The display support medium according to the fourth aspect of the present invention comprises a sheet-like member having a sheet-like form that transmits light, the sheet-like member being divided into a plurality of unit cells, each of the plurality of unit cells being divided into a predetermined number of subcells corresponding to a predetermined number of azimuth angles, projecting members having a light-blocking surface being formed perpendicular to the sheet-like member on top of the sheet-like member at a predetermined azimuth angle in each subcell corresponding to the predetermined azimuth angle, and the subcells including a plurality of microcells for expressing a color of the content. The processing device comprises a storage device for storing the pixel values at the positions corresponding to the unit cells for each of the predetermined number of contents, and a color specifying unit that calculates for each of the predetermined azimuth angles the pixel values to be displayed on the basis of the colors of the display surfaces of the viewable microcells when a unit cell is viewed from a predetermined azimuth angle, and the differences in pixel values at positions corresponding to the unit cell in the content corresponding to the predetermined azimuth values, and specifies the color of the display surface corresponding to each microcell in the unit cell so that the sum of the differences calculated for each of the predetermined number of azimuth angles is smaller.

In the third and fourth aspects of the present invention, the color specifying unit may also group adjacent microcells belonging to a predetermined subcell, correct the average of the values for each channel given to the grouping to the values of the channels for the microcells in the grouping, and notify a printer used to print the colors in the microcells of the range of the grouping.

The fifth aspect of the present invention relates to a program causing a device to function as a processing device according to any one of the first to fourth aspects of the present invention.

The sixth aspect of the present invention relates to a display medium enabling a predetermined number of contents corresponding to a predetermined number of azimuth angles to be displayed from a predetermined elevation angle and azimuth angle. The display medium according to the sixth aspect of the present invention comprises a flat member that reflects light, the flat member being divided into a plurality of unit cells, each of the plurality of unit cells being divided into a predetermined number of subcells corresponding to a predetermined number of azimuth angles, projecting members having a light-blocking surface being formed perpendicular to the flat member on top of the flat member and parallel to a predetermined azimuth angle in each subcell corresponding to the predetermined azimuth angle, and the subcells including a plurality of microcells for expressing a color of the content. The color of each microcell is set so that the content corresponding to each of the predetermined number of azimuth angles can be displayed on the basis of the color given to the microcells other than those concealed by the projecting members when the unit cells are viewed from each of the predetermined number of azimuth angles.

The seventh aspect of the present invention relates to a processing device that determines the color of a display surface on which is affixed a display support medium able to be affixed to a display surface having a flat surface that reflects light and enabling a predetermined number of contents corresponding to a predetermined number of azimuth angles to be displayed from a predetermined elevation angle and azimuth angle. The display support medium according to the seventh aspect of the present invention comprises a sheet-like member having a sheet-like form that transmits light, the sheet-like member being divided into a plurality of unit cells, each of the plurality of unit cells being divided into a predetermined number of subcells corresponding to a predetermined number of azimuth angles, projecting members having a light-blocking surface being formed perpendicular to the sheet-like member on top of the sheet-like member at a predetermined azimuth angle in each subcell corresponding to the predetermined azimuth angle, and the subcells including a plurality of microcells for expressing a color of the content. The processing device comprises a specifying unit that specifies the color of the display surface corresponding to each microcell for each microcell so that the content corresponding to each of the predetermined number of azimuth angles can be displayed on the basis of the color given to the microcells other than those concealed by the projecting members when the unit cells are viewed from each of the predetermined number of azimuth angles.

Effects of the Invention

The present invention is able to provide a processing device, a program, and a display medium that can vividly display content.

BRIEF DESCRIPTION OF THE DRAWINGS

FIG. 1 (*a*) is a perspective view of a display medium according to an embodiment of the present invention, and FIG. 1 (*b*) is a perspective view of a unit cell.

FIG. 2 is a diagram used to explain the relationship between the projecting members and the azimuth angles from which content can be viewed on the display medium.

FIG. 3 is a diagram used to explain portions concealed and not concealed by projecting members.

FIG. 4 (*a*) is a top view of a unit cell according to an embodiment of the present invention, and FIG. 4 (*b*) is a diagram used to explain the azimuth angles from which the content in the unit cell shown in FIG. 4 (*a*) can be ascertained.

FIG. 5 (*a*) is a top view of two subcells in an embodiment of the present invention, and FIG. 5 (*b*) is a diagram that uses the unit cell shown in FIG. 5 (*a*) to explain an example of microcells that are viewable and that are not viewable from a predetermined azimuth angle.

FIG. 6 is a block diagram used to explain the hardware configuration of a processing device used to form a display medium according to an embodiment of the present invention.

FIG. 7 is a flowchart used to explain the processing performed by a processing device according to an embodiment of the present invention.

FIG. 8 is a flowchart used to explain the processing performed by a shape specifying unit according to an embodiment of the present invention.

FIG. 9 is a flowchart used to explain the processing performed by a color specifying unit according to an embodiment of the present invention.

FIG. 10 is a diagram used to explain a display support medium in a modified example.

FIG. 11 is a block diagram used to explain the hardware configuration of a processing device used to form a display medium according to a modified example.

EMBODIMENT OF THE INVENTION

The following is a description of embodiments of the present invention with reference to the drawings. In the descriptions of the figures, identical or similar elements are denoted by the same or similar reference numbers.
(Display Medium)

The display medium 1 in an embodiment of the present invention will now be described with reference to FIG. 1. The display medium 1 in the embodiment of the present invention is formed so that a predetermined number of contents corresponding to a predetermined number of azimuth angles can be displayed from a predetermined elevation angle and azimuth angle. On this display medium 1, content can be displayed when viewed from a predetermined elevation angle at a predetermined azimuth angle and different content can be displayed by changing the azimuth angle. The display medium 1 can display a plurality of contents at each predetermined azimuth angle. The content may also be different at each elevation angle from which the viewer views content. The content in the embodiment of the present invention is a still image.

As shown in FIG. 1 (*a*), the display medium 1 comprises a colored portion 4 provided on the flat surface of a flat member 2. The flat member 2 has a flat surface that reflects light. The flat member 2 may reflect light like a mirrored surface or diffuse light. From the standpoint of improved visibility, the flat member 2 is preferably formed from a metal with a highly mirror-like surface component. The colored portion 4 is a portion colored with ink.

As shown in FIG. 1 (*a*), the flat surface of the flat member 2 is divided into a plurality of unit cells C. The flat surface of the flat member 2 is the display surface of the display medium 1. Also, as shown in FIG. 1 (*b*), each of the plurality of unit cells C is divided into a predetermined number of subcells B corresponding to a predetermined number of azimuth angles. The unit cells C and subcells B may be virtual divisions.

In the example shown in FIG. 1, the flat member 2 is a cuboid. However, it only has to have a flat surface provided with a colored portion 4. In the following explanation the unit cells C and the subcells B are square. However, the unit cells C and the subcells B may have another shape.

The number of subcells B in a single unit cell C corresponds to the number of contents that can be displayed on the display medium 1. For example, in the example shown in FIG. 1, a single unit cell C is divided into three subcells B. Therefore, at least three contents can be displayed. When, for example, the display medium 1 is viewed at a 90-degree elevation angle relative to the flat surface to ascertain new content, the display medium 1 can display content other than the predetermined number of contents that can be viewed at predetermined elevation angles by viewing the flat surface at an elevation angle different from the predetermined elevation angles.

The elevation angle at which content is displayed can vary for each unit cell C. For example, when the display medium 1 is large and each unit C on the display medium 1 is viewed from the same vantage point, the elevation angle at the vantage point relative to the position of each unit cell C may vary depending on the position of the unit cell C.

As shown in FIG. 1 (*b*), plate-like projecting members L are arranged perpendicular to the flat member 2 in each subcell B. In the example shown in FIG. 1 (*b*), two projecting members L are provided in each subcell B. However, each subcell may contain any number of projecting members. For example, a single projecting member L may be provided or a plurality of projecting members L may be provided in each subcell B. The number of projecting members may also be different in each subcell.

The projecting members L have a light-blocking surface on the flat member 2 that is parallel to each of the predetermined number of azimuth angles. The projecting members L may be formed using opaque members that block light or may be formed to allow some light through in a range that does not affect visibility with respect to the viewer. A projecting member L having a surface parallel to a predetermined azimuth angle is formed in each subcell B corresponding to the predetermined azimuth angle.

When a plurality of projecting members L is formed in a single subcell B, the projecting members L are parallel to each other. The projecting members L are arranged in different directions in each subcell B provided with projecting members L, and the projecting members L provided in different subcells B are not parallel to each other.

The projecting members L in the embodiment of the present invention are plate-shaped. However, the projecting members L may assume any shape as long as they have a parallel light-blocking surface on the flat member 2. For example, the ends of two projecting members L may be connected by another plate-shaped member to form a U-shaped configuration. In the embodiment of the present invention, "parallel" does not have to meet the strict definition of parallel as long as visibility remains unaffected.

The display medium 1 in the embodiment of the present invention is viewed at a predetermined elevation angle. Because flat-shaped projecting members L are provided perpendicular to the flat surface of the flat member 2, as shown in FIG. 1 (*b*), the display medium 1 displays content when the display medium 1 is viewed from a predetermined elevation angle to ascertain the colored portions 4 that are not blocked by the projecting members L.

The elevation angles and azimuth angles from which the display medium 1 in the embodiment of the present invention is viewed will now be described with reference to FIG. 2. FIG. 2 (*a*) is used to explain how contents I0, I1, and I2 are displayed on the display medium 1.

When the coordinate x on the display medium 1 is viewed at predetermined elevation angle $\omega 0$ and azimuth angle $\varphi 0$, the coordinate color value for content I0 corresponding to coordinate x on the display medium 1 can be ascertained. When the coordinate x on the display medium 1 is viewed at predetermined elevation angle $\omega 1$ and azimuth angle $\varphi 1$, the coordinate color value for content I1 corresponding to coordinate x on the display medium 1 can be ascertained. When the coordinate x on the display medium 1 is viewed at predetermined elevation angle $\omega 2$ and azimuth angle $\varphi 2$, the coordinate color value for content I2 corresponding to coordinate x on the display medium 1 can be ascertained.

The unit cell C on the display medium 1 shown in FIG. 2 (a) can be formed, for example, as shown in FIG. 2 (b). The unit cell C has three subcells—subcell B0, subcell B1, and subcell B2—corresponding to three contents—content I0, content I1, and content I2. In subcell B0, three projecting members L0 are arranged in subcell B0 parallel to the direction of azimuth angle $\varphi 0$. In subcell B1, two projecting members L1 are arranged in subcell B1 parallel to the direction of azimuth angle $\varphi 1$. In subcell B2, three projecting members L2 are arranged in subcell B2 parallel to the direction of azimuth angle $\varphi 2$.

Because the projecting members L have a predetermined height, there are portions in which light is blocked by the projecting members L and portions in which light remains unblocked when the display medium 1 is viewed from a certain elevation angle. When the viewer views the display medium 1 from a certain elevation angle, the portions in which light is not blocked by the projecting members L are ascertained. When the viewer views the display medium 1, content on the display medium 1 is viewed in the colors given to the portions in which light is not blocked by the projecting members L.

Here, the viewing of subcells B0 and B1 from a predetermined elevation angle and azimuth angle will be explained as shown in FIG. 3. FIG. 3 (a) and FIG. 3 (b) are diagrams in which subcells with the same configuration are viewed from different azimuth angles (vantage points).

In the following explanation, the light M1, M2, and M3 incident on subcells B0 and B1 is light from a light source that is related to viewpoint direction and the specular reflection (when the azimuth angle is 180 degrees and the elevation angle is the same) as shown in FIG. 3 (a). Light M1, M2, and M3 are parallel on subcell B0 to the projecting members provided in subcell B0.

Light M1 incident on subcell B0 reaches the flat surface of the subcell B0 without being blocked by a projecting member, and is reflected by the flat surface of subcell B0 to generate the reflected light M1'. The reflected light M1' is parallel on subcell B0 to the projecting members in subcell B0. In other words, the line projected from reflected light M1' on subcell B0 and the projecting members in subcell B0 are parallel to each other. Because reflected light M1' is not blocked by a projecting member in subcell B0, the viewer can ascertain reflected light M1'. Reflected light M1' has the color that subcell B0 has been colored.

The projecting members in subcell B1 are formed so as to be parallel with the projecting members in subcell B0. Therefore, light M2 incident on subcell B1 is blocked by a projecting member in subcell B1, and light M2 does not reach the flat surface of subcell B1. As a result, the viewer cannot ascertain reflected light from light M2. Light M3 incident on subcell B1 is not blocked by a projecting member, reaches the flat surface of subcell B1, and generates reflected light M3'. However, reflected light M3' is blocked by a projecting member in subcell B1 and the viewer cannot ascertain reflected light M3'.

In the following explanation, the light M4, M5, and M6 incident on subcells B0 and B1 is light from a light source that is related to viewpoint direction and the specular reflection (when the azimuth angle is 180 degrees and the elevation angle is the same) as shown in FIG. 3 (b). Light M4, M5, and M6 are parallel on subcell B1 to the projecting members provided in subcell B1.

Light M4 incident on subcell B0 is blocked by a projecting member in the subcell B0, and light M4 does not reach the flat surface of subcell B0. As a result, reflected light from light M4 cannot be ascertained by the viewer. Light M5 incident on subcell B0 reaches the flat surface of the subcell B0 without being blocked by a projecting member, and reflected light M5' is generated. However, reflected light M5' is blocked by a projecting member in subcell B0, and reflected light M5' cannot be ascertained by the viewer.

Light M6 incident on subcell B1 reaches the flat surface of the subcell B1 without being blocked by a projecting member, and is reflected by the flat surface of subcell B1 to generate light M6'. Reflected light M6' is parallel on subcell B1 to the projecting members in subcell B1. In other words, the line projected from reflected light M6' on subcell B1 and the projecting members in subcell B1 are parallel to each other. Because reflected light M6' is not blocked by a projecting member in subcell B1, the viewer can ascertain the reflected light. Reflected light M6' has the color that subcell B1 has been colored.

When a display medium 1 having subcells B0 and B1 shown in FIGS. 3 (a) and (b) are viewed, reflected light M1' having the color of subcell B0 is viewed from the elevation angle and azimuth angle shown in FIG. 3 (a). Reflected light M6' having the color of subcell B1 is viewed from the elevation angle and azimuth angle shown in FIG. 3 (b). Thus, when the display medium 1 is viewed from different azimuth angles, the colors specific to these subcells can be viewed by the viewer. The same is true of other unit cells, where each unit cell C comprises projecting members L that have surfaces on the flat member 2 that are parallel to the azimuth angles corresponding to each subcell B.

When the viewer views the display medium 1 from a predetermined azimuth angle, the viewer can view, for example, color in subcell B0 of each unit cell C. In this way, the content constituted by subcells B0 of each unit cell C can be viewed. When viewed from a different azimuth angle, the viewer can view, for example, color in subcell B1 of each unit cell C. In this way, the content constituted by subcells B1 of each unit cell C can be viewed. As a result, the display medium 1 can display a plurality of contents depending on the azimuth angle from which the viewer views the display medium 1.

The following is an explanation of a unit cell C that is able to display four or more contents with reference to FIG. 4. The unit cell C shown in FIG. 4 (a) comprises a first subcell B1, a second subcell B2, a third subcell B3, and a fourth subcell B4. Each subcell is colored with the color at that position for each content corresponding to the unit cell. As shown in FIG. 4 (b), relative to the first azimuth $\varphi 1$, the second azimuth $\varphi 2$ is 90 degrees counterclockwise, the third azimuth $\varphi 3$ is 45 degrees counterclockwise, and the fourth azimuth $\varphi 4$ is 135 degrees counterclockwise.

In the first subcell B1, two first projecting members L1 provided on the first subcell B1 are parallel with the first azimuth angle $\varphi 1$ and are parallel to each other. Similarly, in the second subcell B2, two second projecting members L2 provided on the second subcell B2 are parallel with the second azimuth angle $\varphi 2$ and are parallel to each other. In the third subcell B3, two third projecting members L3 provided on the third subcell B3 are parallel with the third azimuth angle $\varphi 3$ and are parallel to each other. In the fourth subcell B4, two fourth projecting members L4 provided on the fourth subcell B4 are parallel with the fourth azimuth angle $\varphi 4$ and are parallel to each other. The first projecting members L1, the second projecting members L2, the third projecting members L3, and the fourth projecting members L4 are arranged so as not to be parallel to each other.

In the embodiment of the present invention, the display medium 1 is formed so that content corresponding to each azimuth angle can be viewed from a plurality of azimuth angles at a predetermined elevation angle. Specifically, when the display medium 1 is viewed from the first azimuth angle φ1, the color in the first subcells B1 can be ascertained. Most of the colors in the other subcells are blocked by the second projecting members L2, the third projecting members L3, and the fourth projecting members L4. Similarly, when the display medium 1 is viewed from the second azimuth angle φ2, the color in the second subcells B2 can be ascertained. When the display medium 1 is viewed from the third azimuth angle φ3, the color in the third subcells B3 can be ascertained. When the display medium 1 is viewed from the fourth azimuth angle φ4, the color in the fourth subcells B4 can be ascertained.

In the display medium 1 in the embodiment of the present invention described with reference to FIG. 1 to FIG. 4, each subcell B includes a plurality of microcells R expressing the colors of content as shown in FIG. 5. Each microcell R is given color expressing the content corresponding to the azimuth angles from which each microcell R can be viewed. In this way, the display medium 1 in the embodiment of the present invention can display content more vividly.

FIG. 5 (a) shows a first subcell B1 in which first projecting members L1 are formed and a second subcell B2 in which second projecting members L2 are formed. Subcells B1 and B2 are each composed of a plurality of microcells R.

The light gray microcells R1 belong to the first subcell B1. The dark gray microcells R2 belong to the second subcell B2. The white microcells indicate where a first projecting member L1 or a second projecting member L2 is formed. In the embodiment of the present invention, the first projecting members L1 and the second projecting members L2 are formed in microcell units.

FIG. 5 (b) is a diagram showing the division of exposed microcells and microcells blocked by projecting members when the first subcell B1 and the second subcell B2 shown in FIG. 5 (a) are viewed from predetermined azimuth angle ω. Azimuth angle ω is parallel to the first projecting members L1 on the first subcell B1. In FIG. 5 (b), the shaded microcells are blocked by the projecting members when viewed from azimuth angle ω. The point cross-hatched microcells are exposed and not blocked by the projecting members when viewed from azimuth angle ω. Given that some of the microcells will be exposed and some of the microcells will be blocked depending on the shape of the projecting members, it is determined whether or not a microcell unit is exposed in the embodiment of the present invention on the basis of whether or not exposure exceeds a predetermined threshold value.

The microcells belonging to the first subcell B1 are divided into microcells in which first projecting members L1 are installed and microcells in which a color is given. Similarly, microcells belonging to the second subcell B2 are divided into microcells in which second projecting members L2 are installed and microcells in which a color is given.

The microcells of the first subcell B1 in which color is given are divided into exposed microcells R1a that are exposed and not blocked by projecting members and blocked microcells R1b that are blocked by projecting members when viewed from azimuth angle ω. Because the first projecting members L1 provided in the first subcell B1 are parallel to azimuth angle ω, some of the microcells are exposed like the exposed microcells R1a and some of the microcells are not visible due to the first projecting members L1 like the blocked microcells R1b.

The microcells of the second subcell B2 in which color is given are divided into exposed microcells R2a that are exposed and not blocked by projecting members and blocked microcells R2b that are blocked by projecting members when viewed from azimuth angle ω. Because the second projecting members L2 provided in the second subcell B2 are parallel to azimuth angle ω, some of the microcells are exposed like the exposed microcells R2a and some of the microcells are not visible due to the second projecting members L2 like the blocked microcells R2b.

The exposed microcells R1a and R2a are exposed when viewed from azimuth angle ω and may also be exposed when viewed from another azimuth angle. The blocked microcells R1b and R2b are not exposed when viewed from azimuth angle ω but may be exposed when viewed from another azimuth angle.

In the display medium 1 according to the embodiment of the present invention, the color of each microcell is set so that the content corresponding to a predetermined number of azimuth angles can be displayed on the basis of the colors provided to the microcells other than the microcells concealed by the projecting members when the unit cell is viewed from each of a predetermined number of azimuth angles. The optimum color is given to each microcell based on whether or not the microcell is exposed relative to the azimuth angles at which the display medium 1 displays content so that the appropriate content can be displayed when viewed from any of the azimuth angles. In this way, content can be displayed more vividly.

(Processing Device)

The processing device 100 used to form the display medium 1 in the embodiment of the present invention will now be described with reference to FIG. 6. When a display medium 1 is formed, data is required such as the size of the unit cells, the size of the subcells, the shapes of the projecting members provided in each subcell, the size of the microcells, and the colors given to microcells. The processing device 100 specifies each type of data based on predetermined conditions. When a display medium 1 is formed by a printer, the data specified by the processing device 100 is inputted to a printer, and the printer jets ink or a UV resin on the flat member 2 based on the inputted data to form the display medium 1.

The processing device 100 is a general-purpose computer equipped with a storage device 110, a processing control device 120, and an input/output interface 130. The processing device 100 can realize the functions shown in FIG. 6 by having a general-purpose computer execute a program for executing predetermined processing.

The storage device 110 can be a ROM (Read Only Memory), a RAM (Random Access Memory), or a hard disk that stores various types of data such as input data, output data, and intermediate data used by the processing control device 120 to execute processing. The processing control device 120 is a CPU (Central Processing Unit) that executes processing in the processing device 100 by reading and writing data stored in the storage device 110 and inputting and outputting data to and from the input/output interface 130. The input/output interface 130 is an interface for connecting the processing control device 120 to an external device (not shown) such as a printer. In the embodiment of the present invention, the input/output interface 130 can be the device that produces the display medium 1 or memory that is read by the device that produces the display medium 1.

The storage device 110 stores condition data 111, shape data 112, inputted color value data 113, and outputted color value data 114.

Condition data 111 is data on the conditions required for the processing control device 120 to perform properly.

Specifically, condition data 111 includes the number of contents to be displayed on the display medium 1, the elevation angles, and the azimuth angles. Condition data 111 may include the sizes of the unit cells C and microcells R formed on the display medium 1, and the color of the projecting members L. Condition data 111 may also include the evaluation coefficient used to optimize the determination of the structures in each unit cell C and to optimize the colors given to microcells, and the initial values for the weighting of each evaluation item when the evaluation coefficient includes a plurality of evaluation items.

Shape data 112 is data related to the shapes inside unit cells C. Shape data 112 is generated by the shape specifying unit 121. The shapes inside unit cells C include at least the size of each subcell B in a unit cell C or the shapes of the projecting members L in each subcell B, and may include both the size of each subcell B in a unit cell C and the shapes of the projecting members L in each subcell B.

The size of subcells B may be, for example, the area ratio of each subcell B in the unit cell C of the display medium 1, or may be the vertical and horizontal lengths of each subcell B. The shape of a projecting member L is the position and height of the projecting member L. When a plurality of projecting members L is formed in a subcell B, the shape of the projecting members L may include the distance between the projecting members L. The distance between the projecting members L is d1 or d2 in FIG. 5 (a). The shape of the projecting members L is set for each subcell B.

The inputted color value data 113 is color value data for the content to be displayed on the display medium 1. The input color value data 113 stores the pixel values at positions corresponding to the unit cell C for each of the contents corresponding to the predetermined number of azimuth angles. In a predetermined unit cell C, the inputted color value data 113 holds the color values for the portion of the content at each position in the unit cell C corresponding to each azimuth angle. The inputted color value data 113 may hold the content to be displayed and the associated azimuth angles at which content can be viewed.

The outputted color value data 114 is data that associates positions on the display medium 1 with color values for the colors at those positions. In the embodiment of the present invention, outputted color value data 114 is set for each microcell R excluding the microcells R on which projecting members L are formed. The outputted color value data 114 is generated by the color specifying unit 123.

The color values in the inputted color value data 113 and the outputted color value data 114 are in a format that can specify the colors to be given to the display medium 1. The color values may be expressed using channel values such as RGB, or may be expressed using color codes that can be converted into color values for each channel.

The processing control device 120 comprises a shape specifying unit 121, a shape outputting unit 122, a color specifying unit 123, and a color value outputting unit 124.

The shape specifying unit 121 specifies the size of each subcell or the shape of the projecting members L in each subcell based on the conditions set forth in the condition data 111 and based on the positions of subcells concealed by the projecting members L when the unit cell C is viewed from each of the predetermined number of azimuth angles, and generates shape data 112.

The shape specifying unit 121 may specify the size of subcells or the shape of the projecting members L in each subcell using optimization based on a predetermined evaluation function. When the evaluation function includes a plurality of evaluation items and the evaluation function performs an evaluation by weighting each of the evaluation items, the shape specifying unit 121 may optimize the weighting for each evaluation item after specifying the optimum size of each subcell or the shapes of the projecting members in each subcell. For example, when the unit cell is viewed from each of a predetermined number of azimuth angles, the shape specifying unit 121 may change the weighting of the evaluation items in the evaluation function used to specify the size of each subcell or the shape of the projecting members in each subcell so that the area of the microcells exposed by the projecting members specified during optimization is greater than or equal to a specified value. The shape specifying unit 121 then optimizes the size of each subcell or the shape of the projecting members in each subcell based on the changed weightings.

The shapes of the projecting members L may be set in common for each subcell corresponding to a predetermined azimuth angle, or different shapes may be set for the projecting members L in each subcell corresponding to a predetermined azimuth angle so that the positional relationship between the unit cell C and the vantage point are taken into account. When the elevation angle or azimuth angle for viewing each unit cell C is not within a specified range, such as when the display medium 1 is large relative to the distance between the assumed vantage point and the display medium 1, different shapes are preferably set for the projecting members L in each subcell corresponding to a predetermined azimuth angle.

The shape outputting unit 122 outputs the shape data 112 generated by the shape specifying unit 121 via the input/output interface 130.

The color specifying unit 123 generates outputted color value data 114 from shape data 112 outputted by the shape specifying unit 121 and inputted color value data 113. The color specifying unit 123 calculates the difference between pixel values displayed based on the colors of microcells R that can be viewed and the pixel values at positions corresponding to the unit cell C for content corresponding to a predetermined azimuth angle when the unit cell C is viewed from the predetermined azimuth angle. The color specifying unit 123 specifies the color of each microcell R in the unit cell C so that the sum of the differences calculated for each of the predetermined number of azimuth angles becomes smaller, and generates outputted color value data 114. The pixel values at positions corresponding to the unit cell C for content corresponding to a predetermined azimuth angle are included in the inputted color value data 113.

The color value outputting unit 124 outputs the outputted color value data 114 generated by the color specifying unit 123. For example, when a display medium 1 is formed using a UV printer, the processing device 100 outputs shape data 112 and outputted color value data 114 to the UV printer.

The process for generating a display medium 1 is set as appropriate. For example, when it is formed by jetting ink using a UV printer, the ink or UV resin is jetted in accordance with the scanning direction of the jetting unit. Specifically, the printer jets ink with the color defined in the outputted color value data 114 at the positions of the microcells R on the flat member 2 and jets UV resin at the positions of the projecting members L while the jetting unit travels in a predetermined direction. Alternatively, the printer may jet ink with the color defined in the outputted color value data 114 at the positions of the microcells R on the flat member 2 while the jetting unit travels in a predetermined direction, and then jets UV resin at the positions of the projecting members L while the jetting unit travels along the same positions.

In the embodiment of the present invention, it is assumed that the display medium 1 is printed using a printer. However, a display medium can also be formed with a size larger than what can be printed using a printer. For example, the microcells R to be colored may be formed on a colored plate with a reflective surface, and the projecting members L may be formed of a plate having a light-shielding surface.

The processing method performed by the processing device 100 in the embodiment of the present invention will now be explained with reference to FIG. 7. In the explanation of the example shown in FIG. 7, the size C of the unit cells and the size of the microcells R are provided in advance, and the processing device 100 calculates the size of the subcells B, the shape of the projecting members L, and the colors in the microcells R.

First, in step S1, the processing device 100 acquires the pixel values of the plurality of contents to be displayed on the display medium 1 and the azimuth angles for displaying each content. In step S2, the processing device 100 acquires the size of the unit cell C and the size of the microcells R.

Next, the processing device 100 repeats the processing in steps S3 to S6 in order to calculate the size of the subcells B, the shape of the projecting members L, and the colors in the microcells R in each unit cell C.

In step S3, the processing device 100 calculates the size of the subcells B and the shape of the projecting members L in the unit cell C to be processed, and outputs the shape data 112 in step S4. In step S5, the processing device 100 calculates the colors in the microcells R of the unit cell C to be processed, and outputs the outputted color value data 114 in step S6.

When the processing in steps S3 to S6 has been completed for each unit cell C, the processing device 100 ends the processing.

(Shape Specifying Unit)

The shape specifying unit 121 will now be described in greater detail. The shape specifying unit 121 specifies the optimum size of each subcell B or the shape of the projecting members L in each subcell B so that the evaluation function in Equation (1) is minimized. The shape specifying unit 121 may fix the shape of the projecting members L to specify the size of each subcell B, or may fix the size of each subcell B to specify the shape of the projecting members L. Also, the shape specifying unit 121 may specify the height, positions, and spacing of the projecting members L as the shape of the projecting members L, or may fix one or more of these elements so that the other elements can be specified.

[Equation 1]

$$E(G) = w_o E_o(G) + w_g E_g(G) + w_s E_s(G) \quad \text{Equation (1)}$$

G: A vector with the ratio of the area of a subcell in a single unit cell, the height and spacing of parallel projecting members, and the positions of projecting members set as variables $w_o$, $w_g$, $w_s$: Weightings for $E_o$, $E_g$, and $E_s$ $E_o$: Amount of light blocked in subcells corresponding to the specified direction $E_g$: Amount of light in subcells other than the subcells corresponding to the specified direction $E_s$: Standard deviation for the reflected brightness of all subcells A small value in Equation (1) means that, in a predetermined unit cell, the amount of light blocked in the subcells corresponding to the specified direction is small, the amount of light from subcells other than the subcells corresponding to the specified direction is small, and the standard deviation for the reflected brightness of each subcell is small. A small amount of light blocked in the subcells corresponding to the specified direction means that the amount of light seen from the subcells corresponding to the specified direction is large when observed from the specified direction, and means that most of the light to be displayed is wanted light. A small amount of light from subcells other than the subcells corresponding to the specified direction means that the amount of light seen from the subcells that do not correspond to the specified direction is small when viewed from the specified direction, and means that very little of the light to be displayed is unwanted light. A small standard deviation for the reflected brightness of each subcell means that the light can be displayed with the same reflection brightness regardless of the specified direction, and means that there is very little difference in brightness depending on the specified direction and the content is easy for the observer to view.

In the embodiment of the present invention, the sizes of the unit cell C and the microcells R, and the initial values of $w_o$, $w_g$, and $w_s$ in the evaluation function shown in Equation (1) are provided in advance in the condition data 111. The shape specifying unit 121 specifies the initial size of each subcell B and a combination of values for the distance, position, and height of the projecting members L in each subcell B. It also specifies the optimum combination of the size of each subcell B in the unit cell C, and the distance, position, and height of the projecting members L in each subcell B to minimize the evaluation value of the evaluation function based on the positions of the microcells R concealed by the projecting members L when the unit cell C is observed from each of the predetermined number of azimuth angles. When specifying the positions of the microcells R concealed by the projecting members L, the position of the microcells R that are exposed and not concealed by the projecting members L is also specified.

Even when the optimum G value (shape inside the unit cell C) that minimizes the evaluation value of Equation (1) has been calculated, the amount of light specified by the optimum G in the specified direction may be small and the display of content may be dark. Because Equation (1) calculates the evaluation value based on the $w_o$, $w_g$, and $w_s$ set as the initial values, a G value that can display the content brightly can be calculated by optimizing the weighting. In Equation (1), $w_o$ is preferably optimized because it is $w_o$ that affects the brightness of the content.

The shape specifying process performed by the shape specifying unit 121 will now be described with reference to FIG. 8.

The shape specifying unit 121 repeats the processing in steps S101 to S108 until the termination conditions specified in terms, for example, of the number of iterations or an amount of time has been satisfied.

First, in step S101, the weightings $w_o$, $w_g$, and $w_s$ are set for the evaluation items in the evaluation function. Weightings $w_o$, $w_g$, and $w_s$ are values set in the condition data 111 when initially calculated, and are set according to a predetermined rule when calculated for a second time and thereafter.

In step S102, the shape specifying unit 121 sets the shape of a unit cell. The shape of a unit cell C is the size of each subcell B and the shape of the projecting members L provided in each subcell B. The shape of the projecting members L is the position and size of the projecting members L, and the distance between projecting members L.

In step S103, the shape specifying unit 121 specifies the exposed microcells R and the blocked microcells R when the unit cell C being processed is viewed from the azimuth angle being processed based on the shape of the unit cell C set in step S102. The processing in step S103 is repeated for each azimuth angle (specified direction) from which the display medium 1 displays content.

In step S104, the shape specifying unit 121 specifies the optimum shape of the unit cell C for minimizing the evaluation value of Equation (1) based on the values obtained in steps S101 to S103.

In step S105, the shape specifying unit 121 determines whether or not the area of the microcells R exposed at each azimuth angle is equal to or greater than a predetermined value based on the shape of the unit cell C specified in step S104. When equal to or greater than a predetermined value, the process returns to step S101 in order to optimize the shape of unit cell C under new conditions.

When not equal to or greater than a predetermined value, the shape specifying unit 121 in step S106 attempts to optimize the weighting so that the area of the microcells R exposed at each azimuth angle is equal to or greater than the predetermined value. When the weighting can be optimized, the shape specifying unit 121 in step S107 optimizes the shape of the unit cell C once again based on the optimized weighting. When the weighting cannot be optimized, the shape specifying unit 121 returns to step S101 in order to optimize the shape of unit cell C under new conditions.

When the processing in steps S102 to S108 has been repeated until the predetermined conditions are satisfied, the shape specifying unit 121 specifies the optimum shape of the unit cell C in step S109, and then ends the process.

In the optimization processing in steps S104 to S108 in FIG. 8, the shape specifying unit 121 specifies the size of each subcell B or the shape of the projecting members L in each subcell B by simulated annealing or genetic algorithm using the evaluation function in Equation (1). Optimization by simulated annealing or genetic algorithm is preferred because the shape of unit cells is discrete in the embodiment of the present invention.

When simulated annealing is used, the shape specifying unit 121 calculates the evaluation value for each combination in a search range formed by combinations of the size of each subcell B and the distance, position, and height of the projecting members L in each subcell B, and determines the combination that minimizes the evaluation value. Next, the shape specifying unit 121 calculates an evaluation value for each of a plurality of selected combinations from a search range including a combination that is narrower than the previous search range and has the minimum evaluation value, and determines the combination that minimizes the evaluation value. The shape specifying unit 121 calculates the optimum combination by repeating the process by further narrowing the previous search range to determine the combination that minimizes the evaluation value.

When a generic algorithm is used, the shape specifying unit 121 repeats a process a predetermined number of times to calculate the evaluation value from combinations obtained by crossing, mutating, or copying the values in combinations of the size of each subcell B, and the distance, position and height of the projecting members L in each subcell B. The shape specifying unit 121 calculates the combination that minimizes the evaluation value among the combinations obtained after repeating the processing a predetermined number of times and uses this as the optimum combination.

The processing in step S106 of FIG. 8 is the optimization processing, in which the shape specifying unit 121 calculates the optimum weighting $w_o$ so that the area of the exposed microcells R at each azimuth angle is equal to or greater than a predetermined value. At this time, the shape specifying unit 121 corrects $w_o$ by viewing the area of the exposed microcells R at each changed azimuth angle while changing $w_o$. In order to automate this process, a gradient method is used to determine weighting $w_o$.

Here, gradient $E'_o$ of the function $E_o$ used to evaluate the number of concealed microcells is calculated using Equation (2).

[Equation 2]

$$E'_o = \frac{E_o(G_{w_o + \Delta w_o}) - E_o(G_{w_o})}{w_o} \quad \text{Equation (2)}$$

$Gw_o$: Structure of unit cell obtained from value function when learning weighting $w_o$ $Gw_o + \Delta w_o$: Structure of unit cell obtained from value function when applying weighting $w_o + \Delta w_o$ Here, $\Delta w_o$ is a small increase in the weighting When gradient $E'_o$ calculated using Equation (2) is a positive value, the number of concealed microcells increases and the content becomes darker as $\Delta w_o$ increases. When gradient $E'_o$ is a negative value, the number of concealed microcells decreases and the content becomes lighter.

In the embodiment of the present invention, because Equation (2) is used to specify the weighting at which the exposed microcell area at each azimuth is greater than or equal to a predetermined value, $w_o$ is updated using Equation (3).

[Equation 3]

$$w_o \leftarrow w_o - \alpha E'_o \quad \text{Equation (3)}$$

α: Control parameter for the gradient

The shape specifying unit 121 specifies the optimum $w_o$ by repeating the process in Equation (3) until $E_o$ reaches a specified value or a predetermined number of times if $E_o$ does not reach the specified value. The shape specifying unit 121 performs the process in step S108 of FIG. 8 based on the optimum $w_o$.

When the display medium 1 is generated by a printer that uses grouping by dithering or error diffusion, the color specifying unit 123 may further correct the value for each channel by grouping and notifying the printer of the grouping range. The printer can generate the display medium 1 by performing grouping by dithering or error diffusion based on the grouping range provided by the color specifying unit 123 to bring the colors closer to those assumed by the color specifying unit 123.

Specifically, the color specifying unit 123 groups adjacent microcells R belonging to a predetermined subcell B, and corrects the averages of the values for each channel in the grouping to the values for the channels in the microcells R of the grouping. In other words, the color specifying unit 123 groups the microcells R so as not to exceed the subcell B, and corrects the colors within the grouping. As a result, the colors at the edges of adjacent subcells B do not intermingle, and the colors of each subcell can be readily identified.

Also, the color specifying unit 123 notifies the printer that will print the colors in the microcells R of the grouping range for the microcells R in a subcell B. In this way, the printer can group microcells based on the grouping provided by the color specifying unit 123 during the grouping process. Because the printer does not perform grouping beyond the subcells B during dithering or error diffusion, the edges between subcells B are clear and content deterioration due to dithering or error diffusion can be prevented. A display medium 1 printed this way can display content to a viewer viewing the medium from a predetermined azimuth angle by suppressing the effect of subcells B adjacent to the subcells B corresponding to the azimuth angle.

(Color Specifying Unit)

The color specifying unit 123 specifies the color of each microcell R so that color close to the content can be displayed from each azimuth angle. At this time, the colors for the microcells R are determined based on C, which minimizes the evaluation value in Equation (4).

[Equation 4]

$$\arg\min(C)\|VC-MP\| \qquad \text{Equation (4)}$$

V: Matrix setting number of rows of content and the number of microcells in each column, and indicating whether or not each microcell is visible from the azimuth angle corresponding to the content C: Matrix setting number of rows in a microcell and the number of channels in the columns of each microcell, and the values for the channels of each microcell P: Matrix setting the number of rows of content and the number of channels in each column, and the values for the channels in the unit cell for each content M: Number of microcells The processing performed by the color specifying unit 123 will now be explained with reference to FIG. 9.

First, in step S201, the color specifying unit 123 acquires from the inputted color value data 113 the pixel values at the positions corresponding to the unit cell C to be processed for each content displayed by the display medium 1.

The color specifying unit 123 repeats the processing steps S202 and S203 until the termination condition is satisfied. In step S202, the color specifying unit 123 sets the color for each microcell R, and optimizes the values for each microcell R so that the evaluation value in Equation (4) is minimized in step S203.

When the processing in step S202 and step S203 has been repeated until a predetermined condition has been satisfied, the color specifying unit 123 in step S204 specifies the optimum color for each microcell R based on the calculation result from step S203.

The processing in step S203 of FIG. 9 is optimization processing, in which the values for the microcells are specified using the multiplicative update rule or the gradient method.

The multiplicative update rule is a method that describes how C changes to approach MP with respect to the current VC value. As shown in Equation (5), when calculating a new C' from the current C, C is continuously multiplied by MP/VC until the result for VC converges and becomes MP. In Equation (5), T is the transpose of V, and ij indicates the matrix index. Here, 1 is substituted for elements that have a value equal to or greater than 1 after an update so that the elements in each matrix are 1 or less.

[Equation 5]

$$C'_{ij}=C_{ij}*(V^T MP)_{ij}/(V^T VC)_{ij} \qquad \text{Equation (5)}$$

In the gradient method, V and P are known and the gradient C' shown in Equation (6) is calculated.

[Equation 6]

$$C' = \begin{pmatrix} \dfrac{\|V(C+\Delta C_0)-MP\|-\|VC-MP\|}{\|\Delta C\|}, \dots, \\ \dfrac{\|V(C+\Delta C_i)-MP\|-\|VC-MP\|}{\|\Delta C\|}, \dots, \\ \dfrac{\|V(C+\Delta C_M)-MP\|-\|VC-MP\|}{\|\Delta C\|} \end{pmatrix} \qquad \text{Equation (6)}$$

$\Delta C_i$: $i$-th displacement in matrix $C$ $\|\Delta C\|$: Amount of displacement In the embodiment of the present invention, C in Equation (6) is updated using Equation (7).

[Equation 7]

$$C \leftarrow C - \alpha C' \qquad \text{Equation (7)}$$

α: Control parameter for the gradient

In the explanation of the processing performed in the embodiment of the present invention, the processing device 100 calculated the color given to each microcell R after specifying the size of each subcell B and the shape of the projecting members L in each subcell B. However, the processing in the present invention is not limited to the processing in the embodiment. The processing device 100 can omit processing for parameters etc. that have already been determined. For example, when the processing device 100 has fixed the size of the subcells B, the processing device 100 calculates the shape of the projecting members L and the colors given to the microcells R. When the size of the subcells B and the shape of the projecting members L is fixed, the processing device 100 calculates the colors given to the microcells R.

Modified Example

In the explanation of the present invention, colored portions 4 and protruding members L are provided on a flat member 2 to form a display medium 1. However, the principles of the invention in the present application explained in the embodiment of the present invention can be realized in different embodiments.

In the modified example, as shown in FIG. 10, a display support medium 11 obtained by forming projecting members L described in the embodiment of the present invention on a sheet-like member that transmits light is affixed to the display surface 13 of a general display device 12 that reflects light. The display device 12 displays an image in which the color in each subcell is determined according to the shapes of the unit cell C, the subcells B, and the projecting members L formed in the display support medium 11. In other words, the display device 12 realizes the colored portions 4 of the embodiment of the present invention electrically.

In this way, different content can be observed from each azimuth angle as in the embodiment of the present invention. The sheet-like member used in the display support medium 11 may be formed from a transparent member that transmits light, or may be formed so that some light is transmitted within a range that does not affect visibility for the viewer. Here, the display device 12 is preferably a liquid crystal display, an organic EL display, etc., that uses a bright backlight or bright light-emitting elements.

Because the display device 12 can display any image, the appropriate image can be displayed depending on the circumstances. Also, when the image displayed on the display device 12 is constantly changing, different video content can be viewed from each azimuth angle.

Because the image displayed on the display device 12 corresponds to the subcells formed on the display support medium 11, the image is properly aligned so that the display support medium 11 is affixed properly to the display surface 13.

In the modified example, the display surface of the display device 12 includes a plurality of microcells R expressing the colors of the content at positions corresponding to the subcells B.

In the modified example, the processing device 100a shown in FIG. 12 is used to properly generate the display support medium 11 and display the appropriate images on the display device 12. The processing device 100a in the modified example is the same as the processing device 100 described with reference to FIG. 7, but the output destination for the data is different. The shape specifying unit 121 outputs shape data 112 via the input/output interface 130 to the device that produces display support medium 11 or to a memory read by the device that produces the display support medium 11.

The color specifying unit 123 in the modified example specifies the colors for each microcell R on the display surface corresponding to the microcells R so that content corresponding to a predetermined number of azimuth angles can be displayed when viewing the unit cell from each of the predetermined number of azimuth angles based on the colors given to the display surface corresponding to the microcells R other than the microcells R concealed by the projecting members. More specifically, the color specifying unit 123 calculates the differences between the pixel values displayed based on the colors on the display surface corresponding to the visible microcells R and the pixel values at the positions corresponding to the unit cell for content corresponding to a predetermined azimuth angle when the unit cell is viewed from the predetermined azimuth angle, and identifies the colors on the display surface corresponding to each microcell R of the unit cell C so that the sum of the differences calculated for each of the predetermined number of azimuth angles is small.

In the embodiment of the present invention, color is given to the microcells R. However, in the modified example, the color is given to the positions on the display surface of the display device 12 making contact with microcells R. Due to the structure of the display surface, a transparent member such as glass may be provided on the display surface, and the transparent member may cover the elements that output color. In this case, the color given to the microcells R is expressed by the elements directly beneath the transparent member which comes into contact with the microcells R.

The color value outputting unit 124 outputs outputted color value data 114 to the display device 12 to which the display support medium 11 is affixed, or to memory, etc. that can be read by the display device 12. The display device 12 has a display unit that displays the colors specified by the color specifying unit 123 at the positions corresponding to each microcell R on the display surface based on the outputted color value data 114. The display unit displays the colors specified for each microcell R on the display surface corresponding to each microcell R so that content corresponding to a predetermined number of azimuth angles can be displayed when viewing the unit cell from each of the predetermined number of azimuth angles based on the colors given to the display surface corresponding to the microcells R other than the microcells R concealed by the projecting members.

The display support medium 11 in the modified example is suitable for use when the user wishes to display different images depending on the azimuth angle. The display support medium 11 can, for example, display information that depends on the position of each viewer and on other conditions when a plurality of viewers is viewing the display support medium 11 affixed to the display device 12 from different directions.

In the explanation of the modified example, the display support medium 11 is affixed to a display device 12. However, when the color of the microcells R is printed, a printer using grouping by dithering or error diffusion preferably performs grouping by dithering or error diffusion from the processing device 100a based on the range of microcells R grouped by the color specifying unit 123 as in the embodiment of the present invention.

OTHER EMBODIMENTS

While an embodiment of the present invention and a modified example were described above, the statements and drawings that form a part of this disclosure should not be construed as limiting the invention in any way. It should be clear from this disclosure to those skilled in the art that the alternative embodiments, examples, and operational techniques are possible.

For example, the processing device described in the embodiment of the present invention may be configured using hardware as shown in FIG. 6, or may be configured using a plurality of hardware components according to function and the number of processes. It may also be realized in an existing processing device.

Also, the flowcharts referred to in the embodiment of the present invention show examples of processing, and the present invention is not limited to these examples.

It goes without saying that the present invention includes various embodiments not described herein. Therefore, from the description provided above, the technical scope of the present invention is appropriately determined only by the invention specific matters in the claims.

KEY TO THE DRAWINGS

1: Display medium
2: Flat member
4: Colored portion
11: Display support medium
12: Display device
100: Processing device
110: Storage device
111: Condition data
112: Shape data
113: Inputted color value data
114: Outputted color value data
120: Processing control device
121: Shape specifying unit
122: Shape outputting unit
123: Color specifying unit
124: Color value outputting unit
B: Subcell
C: Unit cell
L: Projecting member
R: Microcell

The invention claimed is:

1. A processing device configured to produce a display medium enabling a predetermined number of contents corresponding to a predetermined number of azimuth angles to be displayed from a predetermined elevation angle and azimuth angle,
wherein the display medium comprises
a flat member that reflects light or a sheet-like member having a sheet-like form that transmits light,
the flat member or the sheet-like member being divided into a plurality of unit cells,
each of the plurality of unit cells being divided into a predetermined number of subcells corresponding to the predetermined number of azimuth angles,
projecting members having a light-blocking surface being formed perpendicular to the flat member or the sheet-like member on top of the flat member or sheet-like member and parallel to a predetermined azimuth angle in each subcell corresponding to the predetermined azimuth angle, and
the subcells including a plurality of microcells for expressing a color of a content, and wherein the processing device comprises
a shape specifying unit that specifies a size of each subcell or a shape of the projecting members in each subcell in a unit cell on the basis of a position of the microcells concealed by the projecting members in a case where the unit cell is observed from each of the predetermined number of azimuth angles.

2. The processing device according to claim 1, wherein the shape specifying unit specifies the size of each subcell or the shape of the projecting members in each subcell using simulated annealing.

3. The processing device according to claim 1, wherein the shape specifying unit specifies the size of each subcell or the shape of the projecting members in each subcell using a genetic algorithm.

4. The processing device according to claim 1, wherein the shape specifying unit, after specifying the size of each subcell or the shape of the projecting members in each subcell, changes a weighting of evaluation items in the evaluation function used to specify the size of each subcell or the shape of the projecting members in each subcell so that an area of the microcells exposed with respect to the projecting members is equal to or greater than a specified value in the case where the unit cell is viewed from each of the predetermined number of azimuth angles.

5. A processing device configured to produce a display medium that determines a color of a display surface in the display medium enabling a predetermined number of contents corresponding to a predetermined number of azimuth angles to be displayed from a predetermined elevation angle and azimuth angle,
wherein the display medium comprises p2 a flat member that reflects light or a sheet-like member having a sheet-like form that transmits light,
the flat member or the sheet-like member being divided into a plurality of unit cells,
each of the plurality of unit cells being divided into a predetermined number of subcells corresponding to the predetermined number of azimuth angles,
projecting members having a light-blocking surface being formed perpendicular to the flat member or sheet-like member on top of the flat member or sheet-like member and parallel to a predetermined azimuth angle in each subcell corresponding to the predetermined azimuth angle, and
the subcells including a plurality of microcells for expressing a color of athe content, and
wherein the processing device comprises
a storage device for storing the pixel values at the positions corresponding to the unit cells for each of the predetermined number of contents, and
a color specifying unit that calculates for each of the predetermined azimuth angles pixel values to be displayed on a basis of colors of viewable microcells in a case where a unit cell is viewed from a predetermined azimuth angle, and the differences in pixel values at positions corresponding to the unit cell in the content corresponding to each of the predetermined azimuth values, and
specifies the color of each microcell in the unit cell so that a sum of the differences calculated for each of the predetermined number of azimuth angles is smaller.

6. The processing device according to claim 5, wherein the color specifying unit also groups adjacent microcells belonging to a predetermined subcell, corrects an average of values for each channel given to a grouping to values of channels for the microcells in the grouping, and notifies a printer used to print a colors of each microcells of the range of the grouping.

7. A display medium enabling a predetermined number of contents corresponding to a predetermined number of azimuth angles to be displayed from a predetermined elevation angle and azimuth angle,
wherein the display medium comprises
a flat member that reflects light or a sheet-like member having a sheet-like form that transmits light,
the flat member being divided into a plurality of unit cells,
each of the plurality of unit cells being divided into the predetermined number of subcells corresponding to a predetermined number of azimuth angles,
projecting members having a light-blocking surface being formed perpendicular to the flat member or the sheet-like member on top of the flat member or the sheet-like member and parallel to a predetermined azimuth angle in each subcell corresponding to the predetermined azimuth angle, and
the subcells including a plurality of microcells for expressing a color of a content, and
wherein a color of each microcell is set so that the content corresponding to each of the predetermined number of azimuth angles can be displayed on a basis of the color given to the microcells other than those concealed by the projecting members in a case where the unit cells are viewed from each of the predetermined number of azimuth angles.

* * * * *